(12) United States Patent
Tian et al.

(10) Patent No.: US 9,803,655 B2
(45) Date of Patent: Oct. 31, 2017

(54) AIRFLOW ACCELERATING DEVICE AND ELECTRONIC APPARATUS

(71) Applicants: Beijing Lenovo Software Ltd., Beijing (CN); Lenovo (Beijing) Limited, Beijing (CN)

(72) Inventors: Ting Tian, Beijing (CN); Jinyu Li, Beijing (CN)

(73) Assignees: Beijing Lenovo Software Ltd., Beijing (CN); Lenovo (Beijing) Limited, Beijing (CN)

(*) Notice: Subject to any disclaimer, the term of this patent is extended or adjusted under 35 U.S.C. 154(b) by 330 days.

(21) Appl. No.: 14/613,922

(22) Filed: Feb. 4, 2015

(65) Prior Publication Data

US 2015/0322954 A1 Nov. 12, 2015

(30) Foreign Application Priority Data

May 12, 2014 (CN) ............................ 2014 1 0199222
May 28, 2014 (CN) ............................ 2014 1 0232265

(51) Int. Cl.
F04D 33/00 (2006.01)
F04D 23/00 (2006.01)
H05K 7/20 (2006.01)
G06F 1/20 (2006.01)

(52) U.S. Cl.
CPC ........... *F04D 33/00* (2013.01); *F04D 23/006* (2013.01); *G06F 1/203* (2013.01); *H05K 7/20172* (2013.01)

(58) Field of Classification Search
CPC .... F04B 43/046; F04B 45/043; F04B 45/047; H05K 7/20
See application file for complete search history.

(56) References Cited

U.S. PATENT DOCUMENTS 8,081,454 B2 * 12/2011 Ishikawa ................... F04F 7/00
165/122
2011/0157827 A1 6/2011 Chao

FOREIGN PATENT DOCUMENTS

| CN | 102238848 A | 11/2011 |
|---|---|---|
| CN | 102245005 A | 11/2011 |
| CN | 202949683 U | 5/2013 |
| CN | 203453141 U | 2/2014 |

OTHER PUBLICATIONS

"Chinese Application No. 201410199222.0, Office Action dated Mar. 14, 2017", (Mar. 14, 2017), 5 pgs.

* cited by examiner

*Primary Examiner* — Patrick Hamo
(74) *Attorney, Agent, or Firm* — Schwegman Lundberg & Woessner, P.A.

(57) ABSTRACT

The present invention discloses an airflow accelerating device and an electronic apparatus. The airflow accelerating device comprises: a housing, having a chamber formed therein; at least one vibrating plate, disposed within the chamber; at least one division plate, fixed in the housing, for dividing the chamber into at least two sub-chambers, each of the at least two sub-chambers having at least one air outlet configured to transmit airflow generated by vibration of the vibrating plate to outside of the chamber.

17 Claims, 6 Drawing Sheets

AIRFLOW ACCELERATING DEVICE AND ELECTRONIC APPARATUS

CROSS-REFERENCE TO RELATED APPLICATION

This application claims the benefit of priority to Chinese Patent Application No. 201410199222.0 filed on May 12, 2014 and claims the benefit of priority to Chinese Patent Application No. 201410232265.4 filed on May 28, 2014, the disclosures of which are incorporated herein by reference in their entirety.

BACKGROUND OF THE INVENTION

1. Field of the Invention

The present disclosure generally relates to a technical field of electronics, in particular to an airflow accelerating device and an electronic apparatus.

2. Description of the Related Art

As the development of science and technology and the advancement of the society, electronic apparatuses such as computers, mobile phones and TVs have become an integral part of the people's lives and work. Performance and appearance of the electronic apparatuses have been improved largely, wherein notebook computers have been more and more popular due to advantages such as small volume and less weight, conveniently portable, strong entertaining or the like, and become one necessary part of the people's study and lives. Users can do more and more things, such as performing communication with notebook computers or tablet computers having the communication function, sharing music or videos, watching films, playing games and so on.

Because the electronic apparatus will generate a large amount of heat during the operation, in order to ensure normal operation of electronic devices within the electronic apparatus, it is often to provide a heat dissipating element within the electronic apparatus. Specifically, the electronic apparatus includes heat generating devices (for example, CPU, heat generating elements or the like) which will produce heat when it is working, a heat dissipating element for absorbing the heat and an airflow accelerating device for enhancing airflow speed around the heat dissipating element.

The existing airflow accelerating device usually employs vibration fans or cooling fans. The vibration fan often includes a housing provided with an air outlet and a vibrating plate provided within the housing. When the vibration fan is turned on, the vibrating plate vibrates along up and down directions, thereby accelerating the airflow through the air outlet. In this way, the flowing speed of the air around the heat dissipating element is enhanced, in order to cool the heat generating element.

However, with miniaturization of the electronic apparatus, a size of the airflow accelerating device is decreasing gradually. After such size reduction, due to vibration frequency, the vibrating plate may resonate with the airflow accelerating device per se or the surrounding structures thereof, thereby causing the vibration of the electronic apparatus.

In addition, the current cool fans are mainly rotary blade fans. A minority of the cool fans employed by the electronic apparatus are film vibration fans. The rotary blade fan mainly utilizes centrifugally blowing wind, i.e., the air is blown out from all sides along a radial direction of a rotation plane of the blade. In contrast, the film vibration fan generates wind by the vibration of a thin film in a limited space, and the wind is directed to the heat generating element through the air outlet in a horizontal direction, in order to dissipate the heat. Therefore, the wind produced by the cool fan for dissipating the heat in the electronic apparatus is mainly used to dissipate the heat in the horizontal direction. However, in order to serve for heat sources in a vertical direction, it is necessary to design an external flow channel, for changing the blowing direction of the wind. Thus, the wind is sent to the heat sources or the heat dissipating element. But too much external channels would generate very large system resistance, so that the amount of wind will be reduced. In this case, it causes the insufficient wind sent to the heat sources or the heat dissipating element, thereby resulting in bad effect of dissipating the heat in the electronic apparatus.

SUMMARY OF THE INVENTION

An object of the present invention is intended to solve or mitigate at least one aspect of the above problems and defects exiting in the art.

One object of the present invention is to provide an airflow accelerating device and an electronic apparatus. It suppresses an issue in the art that after size of the airflow accelerating device is reduced, the vibrating frequency of the vibrating plate of the airflow accelerating device may cause it to resonate with the airflow accelerating device per se or the periphery structure thereof, thereby resulting in the vibration of the electronic apparatus.

Another object of the present invention is to provide an airflow accelerating device and an electronic apparatus, which solves the technical problem that the dissipating effect becomes bad due to too many air passage arranged externally.

In accordance with one aspect of the present invention, it provides an airflow accelerating device, comprising:

a housing, having a chamber formed therein;

at least one vibrating plate, disposed within the chamber;

at least one division plate, fixed in the housing, for dividing the chamber into at least two sub-chambers, each of the at least two sub-chambers having at least one air outlet configured to transmit airflow generated by vibration of the vibrating plate to outside of the chamber.

In one example, the at least one division plate comprises M−1 division plates, for dividing the chamber into M sub-chambers, wherein M is a positive integer greater than 1;

the at least one vibrating plate comprises M vibrating plates, disposed within the M sub-chambers respectively, and fixed on the housing or the division plate;

wherein in the case that the airflow accelerating device starts, at least two adjacent vibrating plates among the M vibrating plates have opposite vibrating directions.

In one example, the M vibrating plates are sequentially arranged within the M adjacent sub-chambers, and any two adjacent vibrating plates among the M vibrating plates have opposite vibrating directions.

In one example, the M vibrating plates comprises at least one group of vibrating plates, the at least one group of vibrating plates comprises a first, a second and a third vibrating plates, and the first vibrating plate and the third vibrating plate are located adjacent to each other in a plane and have the same vibrating direction, and the second vibrating plate is located parallel to the plane.

In one example, at least one part of a projection of the second vibrating plate onto the plane overlaps with the first vibrating plate and at least another part of the projection overlaps with the third vibrating plate, and the second vibrating plate is heavier than any one of the first and third vibrating plates.

In one example, the weight of the second vibrating plate is equal to a sum of weights of the first and third vibrating plates.

In one example, the M vibrating plates include at least one group of vibrating plates, the at least one group of vibrating plates comprises a first, a second and a third vibrating plates, the second vibrating plate is heavier than any one of the first and third vibrating plates.

In one example, the weight of the second vibrating plate is equal to a sum of weights of the first and third vibrating plates.

In one example, the at least one vibrating plate is one vibrating plate, which is capable of vibrating in a vertical direction perpendicular to the surface of the vibrating plate;

the division plate is perpendicularly connected with the vibrating plate to form a L-shaped structure with the vibrating plate, and the housing is divided into a first sub-chamber and a second sub-chamber by the division plate and the vibrating plate, and wind generated by the vibration of the vibrating plate is transmitted to outside of the first and second sub-chambers through at least one air outlet of the first sub-chamber and the second sub-chamber on a same surface of the housing.

In one example, the same surface is one of surfaces of the housing parallel to the surface of the vibrating plate.

In one example, in the first sub-chamber the wind generated by the vibration plate is transmitted to a first air outlet in the at least one air outlet in the vertical direction; while in the second sub-chamber, the wind generated by the vibrating plate is transmitted to a second air outlet in the at least one air outlet via a first direction parallel to the vibrating plate and a second direction parallel to the division plate, wherein the first direction is perpendicular to the second direction.

In one example, the division plate includes a first fixation end and a second fixation end, wherein the first fixation end is connected with the first surface, and the second fixation end is connected with the vibrating plate.

In one example, the first air outlet is located at a part of the first surface belonging to the first sub-chamber, and the second air outlet is located at the other part of the first surface belonging to the second sub-chamber.

In one example, the first and second air outlets are positioned at either side of the division plate respectively.

In one example, a shape of the first sub-chamber is different from a shape of the second sub-chamber.

In accordance with another aspect of the present invention, it provides an electronic apparatus, comprising:

a heat generating device;

the airflow accelerating device as described above, so as to dissipate heat of the heat generating device.

In one example, the M vibrating plates are sequentially arranged within the M adjacent sub-chambers and any two adjacent vibrating plates among the M vibrating plates have opposite vibrating directions, the M vibrating plates comprise at least one group of vibrating plates, the at least one group of vibrating plates comprises a first, a second and a third vibrating plates, and the second vibrating plate is heavier than any one of the first and third vibrating plates.

In one example, the M vibrating plates comprise at least one group of vibrating plates, and the at least one group of vibrating plates comprises a first, a second and a third vibrating plates, and the first vibrating plate and the third vibrating plate are located adjacent to each other in a plane and have the same vibrating direction, and the second vibrating plate is located parallel to the plane, wherein at least one part of a projection of the second vibrating plate onto the plane overlaps with the first vibrating plate, and at least another part of the projection overlaps with the third vibrating plate, wherein the second vibrating plate is heavier than any one of the first and third vibrating plates.

In accordance with yet another aspect of the present invention, it provides an electronic apparatus, comprising:

a heat generating device;

the airflow accelerating device as described above, to dissipate heat of the heat generating device.

In one example, the same surface is one of surfaces of the housing parallel to the surface of the vibrating plate, wherein in the first sub-chamber the wind generated by the vibration plate is transmitted to a first air outlet in the at least one air outlet in the vertical direction; while in the second sub-chamber, the wind generated by the vibrating plate is transmitted to a second air outlet in the at least one air outlet via a first direction parallel to the vibrating plate and a second direction parallel to the division plate, wherein the first direction is perpendicular to the second direction.

The airflow accelerating device and the electronic apparatus provided according to the first embodiment of the present invention have the following advantages:

Within the above described electronic apparatus, the airflow accelerating device is provided with the M−1 division plates for separating the chamber of the housing into the M sub-chambers, and the first and second vibrating plates are disposed at least within any two adjacent sub-chambers. When the airflow accelerating device starts, the first vibrating plate has the vibrating direction opposite to that of the second vibrating plate. Since the vibrating direction of the first vibrating plate is opposite to that of the second vibrating plate, the vibrating force transmitted to the division plate from the first vibrating plate has the direction opposite to that transmitted to the division plate from the second vibrating plate, and they may counteract one another. In this way, it reduces the influence of the vibration of the first and second vibrating plates to the airflow accelerating device per se or the surrounding structures thereof, and reduces the probability that the vibrating frequency of the first and second vibrating plates can cause them to resonate with the airflow accelerating device per se or the surrounding structures thereof. With such arrangement, this suppresses the issue that after the size of the airflow accelerating device is reduced, the vibrating frequency of the vibrating plates of the airflow accelerating device causes it to resonate with the airflow accelerating device per se or the surrounding structures thereof, thereby resulting in the vibration of the electronic apparatus.

In one example, the third vibrating plate having the same vibrating direction as that of the first vibrating plate is provided at the other side of the second vibrating plate, so that when the airflow accelerating device starts, due to the vibrating direction of the first and third vibrating plates opposite to that of the second vibrating plate, the vibrating force transmitted to the division plate between the first and second vibrating plates from the first vibrating plate has the direction opposite to the vibrating force transmitted to the same division plate from the second vibrating plate, and they may counteract one another; and the vibrating force transmitted to the division plate between the third and second vibrating plates from the third vibrating plate has the direction opposite to the vibrating force transmitted to the same division plate from the second vibrating plate, and they may counteract one another. In this way, it will further reduce the influence of the vibration of the first, second and third vibrating plates to the airflow accelerating device per se or the surrounding structures thereof.

In another example, the weight of the second vibrating plate is disposed to be greater than that of the first vibrating plate and that of the third vibrating plate, or be equal to the sum of the weights of the first and third vibrating plates, so that the second vibrating plate can counteract the vibration generated by the first and third vibrating plates as much as possible, and further reduce the influence of the vibration of the first, second and third vibrating plates to the airflow accelerating device per se or the surrounding structures thereof.

Within the airflow accelerating device and the electronic apparatus in accordance with the second embodiment of the present invention, within the airflow collecting box, the vibration of the vibrating plate in the vertical direction can produce a large amount of wind, and the generated wind can be transmitted to outside of the airflow collecting box through the at least one air outlet. Since the at least one air outlet is located at the first surface, the first surface is the upper surface when the airflow collecting box is horizontally arranged, the wind generated by the vibrating plate can flow toward the at least one air outlet within the airflow collecting box, thereby forming a wind having a specific direction, for example vertically blowing. When the heat source or the heat sink is present above the airflow collecting box, the heat can be dissipated directly through the wind blowing from the at least one air outlet. In this way, it ensures the strength of the wind, and may provide a better heat dissipating effect for the electronic apparatus.

BRIEF DESCRIPTION OF THE DRAWINGS

These and other aspects as well as advantages of the present invention will become apparent and readily understood from the description of the preferred embodiments taking in conjunction with the accompanying drawings, in which.

DETAILED DESCRIPTION OF THE EMBODIMENTS

Figure 1:
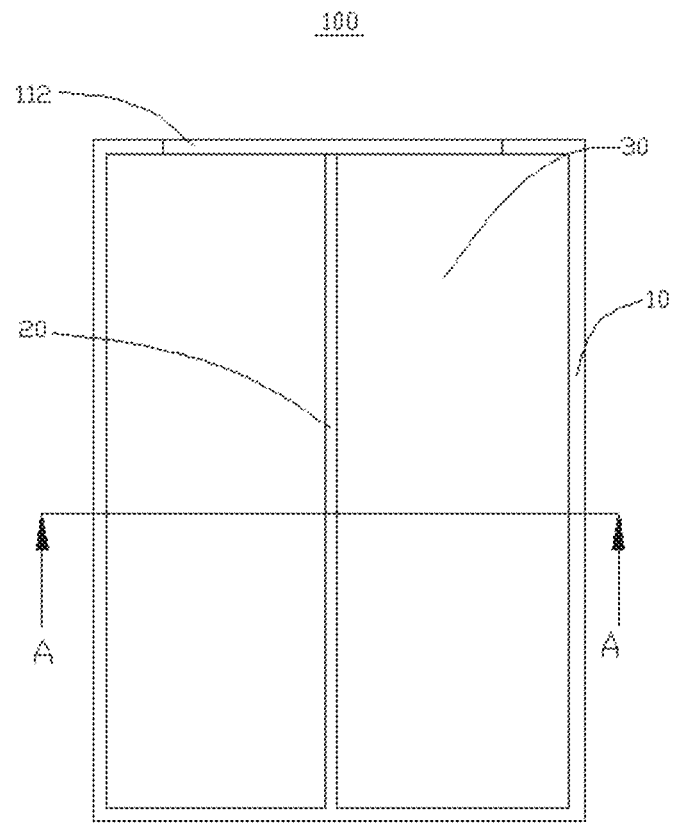
FIG. 1 is a schematic view for showing a sectional structure of an airflow accelerating device according to a first example of a first embodiment of the present invention.

Technical solutions of the present invention will be described hereinafter in more detail by the way of embodiment with reference to figures of the attached drawings, wherein the same or like reference numerals refer to the same or like elements throughout the specification. The explanation to the embodiment of the present invention with referring to the accompanying drawings is intended to interpret the general inventive concept of the present invention, rather than being construed as a limiting to the present invention.

In respective embodiments of the present invention, the electronic apparatus can be PC (personal computer), notebook, PAD (tablet computer), mobile phone and so on, and the present invention is not limited to these.

In addition, a term "and/or" in the present context only means a correlated relationship for describing correlated subjects, having three meanings, for example only A, only B, and A with B. Moreover, the character "/" in the present context generally means the relationship "or" of the correlated subjects.

First Embodiment

The present embodiment of the present invention provides an airflow accelerating device, which alleviates the technical problem in the art that the vibrating frequency of the vibrating plate of the airflow accelerating device may cause it to resonate with the airflow accelerating device per se or the surrounding structure thereof, after the size of the airflow accelerating device is reduced, thereby resulting in the vibration of the electronic apparatus.

In order to solve the above technical problem, the general inventive concept of the technical solution of the present embodiment of the present invention is as follows:

An airflow accelerating device includes a housing, M−1 division plates, and M vibrating plates. The housing has a chamber formed therein, and the M−1 division plates are fixed within the housing, so as to divide the chamber into M sub-chambers. Each one of the M sub-chambers is provided with at least one air outlet, wherein M is a positive integer greater than 1. The M vibrating plates are respectively arranged within the M sub-chambers, and fixed onto the housing or the division plates. When the airflow accelerating device starts, at least two adjacent vibrating plates among the M vibrating plates have opposite vibrating directions.

In order to better understand the above described technical solution, it will be explained in detail in conjunction with the accompanying drawings and specific examples thereof.

As shown in FIG. 1, it is a schematic view for showing a sectional structure of an airflow accelerating device 100 according to a first example of the present invention. The airflow accelerating device 100 is used to accelerate the airflow, and can be any accelerating device for accelerating the airflow through vibration. In the present example, the airflow accelerating device 100 is specified as a film vibration fan.

Figure 2:
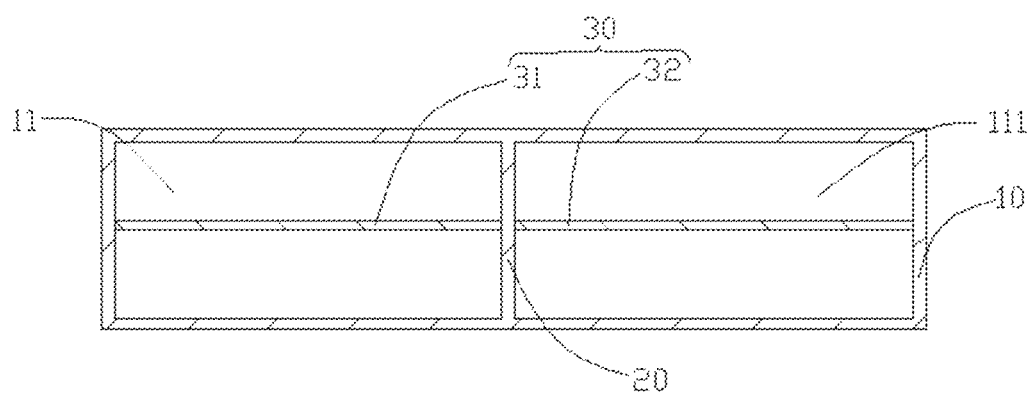
FIG. 2 is a schematic view cut along A-A direction of the airflow accelerating device as shown in FIG. 1.

In combination with FIG. 2, the airflow accelerating device 100 includes a housing 10, M−1 division plates 20 and M vibrating plates 30. One chamber 11 is formed within the housing 10.

The M−1 division plates 20 are fixed within the housing 10. The M−1 division plates 20 are used to divide the chamber into M sub-chambers 111, wherein M is a positive integer greater than 1. The sizes of the M sub-chambers can be identical, or different from each other, as required. In the first example of the first embodiment, the M sub-chambers 111 have the same sizes. Of course, in other examples, they can have different sizes.

In addition, each of the M sub-chambers 111 is provided with at least one air outlet 112. The respective air outlets 112 can be provided at the same side wall of the housing 10, or at the different side walls of the housing 10. In the first example, all the air outlets 112 can be provided on the same side wall of the housing 10. In other examples, the air outlets 112 can be provided on the different side walls of the housing 10.

The M vibrating plates 30 can be respectively disposed within the M sub-chambers 111, and fixed on the housing 10 or the division plates 20. The M vibrating plates 30 can be sized according to sizes of the corresponding sub-chambers among the M sub-chambers 111. Of course, the M sub-chambers 111 can be sized according to sizes of the corresponding vibrating plates 30. In other words, the sizes of the M vibrating plates 30 can be identical or different, as long as the corresponding sub-chambers 111 can accommodate the corresponding vibrating plates 30.

As shown in FIGS. 1 and 2, the M vibrating plates 30 only include a first vibrating plate 31 and a second vibrating plate 32 disposed adjacent to the first vibrating plate 31. The first and second vibrating plates 31 and 32 are respectively disposed within two adjacent sub-chambers 111 in the M sub-chambers 111. It should be noted herein that the number of the vibrating plates 30 is not limited to two, and such arrangement herein is only for sake of simple description and illustration. The person skilled in the art should be understood that the vibrating plates 30 can include at least one group of such first and second vibrating plates 31 and 32.

When the airflow accelerating device 100 starts, the vibrating direction of the first vibrating plate 31 is opposite to that of the second vibrating plate 32, and a part of vibrating force generated by the first and second vibrating forces 31 and 32 is transmitted to the housing 10 and the division plate 20 located between the first and second vibrating plates 31 and 32. Because the vibrating direction of the first vibrating plate 31 is opposite to that of the second vibrating plate 32, the vibrating force transmitted to the division plate 20 from the first vibrating plate 31 has the direction opposite to that transmitted to the division plate 20 from the second vibrating plate 32, and they may counteract one another. In this way, it reduces the influence of the vibration of the first and second vibrating plates 31 and 32 to the airflow accelerating device 10 per se or the surrounding structures, and reduces the probability that the vibrating frequency of the first and second vibrating plates 31 and 32 can cause them to resonate with the airflow accelerating device 100 per se or the surrounding structures.

The above described airflow accelerating device 100 is provided with the M−1 division plates 20 for separating the chamber 11 of the housing 10 into the M sub-chambers, and the first and second vibrating plates 31 and 32 are disposed within any two adjacent sub-chambers. When the airflow accelerating device 100 starts, the first vibrating plate 31 has the vibrating direction opposite to that of the second vibrating plate 32. Since the vibrating direction of the first vibrating plate 31 is opposite to that of the second vibrating plate 32, the vibrating force transmitted to the division plate 20 from the first vibrating plate 31 has the direction opposite to that of the vibrating force transmitted to the division plate 20 from the second vibrating plate 32, and they may counteract one another. In this way, it reduces the influence of the vibration of the first and second vibrating plates 31 and 32 to the airflow accelerating device 100 per se or the surrounding structures thereof, and reduces the probability that the vibrating frequency of the first and second vibrating plates 31 and 32 can cause them to resonate with the airflow accelerating device 100 per se or the surrounding structures thereof. With such arrangement, this suppresses the issue that after the size of the airflow accelerating device 100 is reduced, the vibrating frequency of the vibrating plates of the airflow accelerating device 100 causes it to resonate with the airflow accelerating device 100 per se or the surrounding structures thereof, thereby resulting in the vibration of the electronic apparatus.

Figure 3:
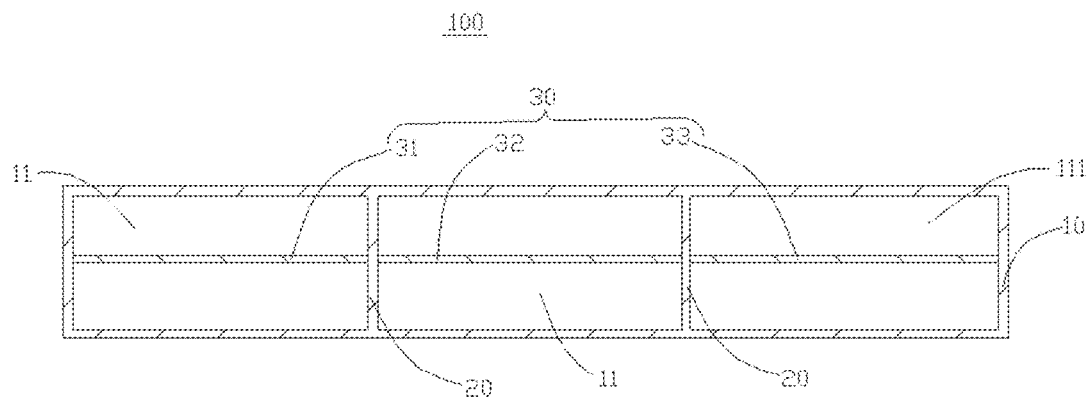
FIG. 3 is a schematic view for showing a sectional structure of an airflow accelerating device according to a second example of the first embodiment of the present invention.
Figure 4:
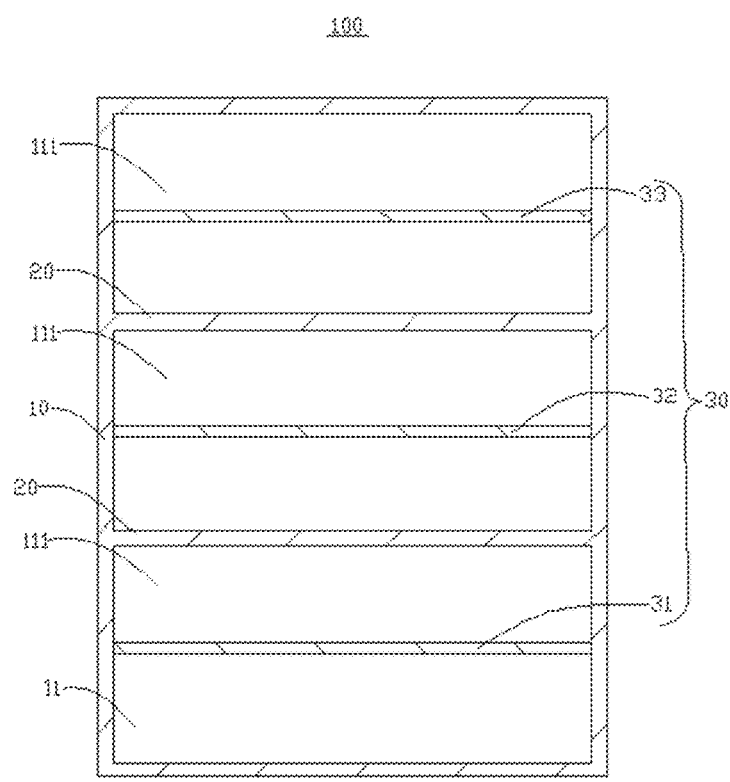
FIG. 4 is a schematic view for showing a sectional structure of an airflow accelerating device according to a third example of the first embodiment of the present invention.
Figure 5:
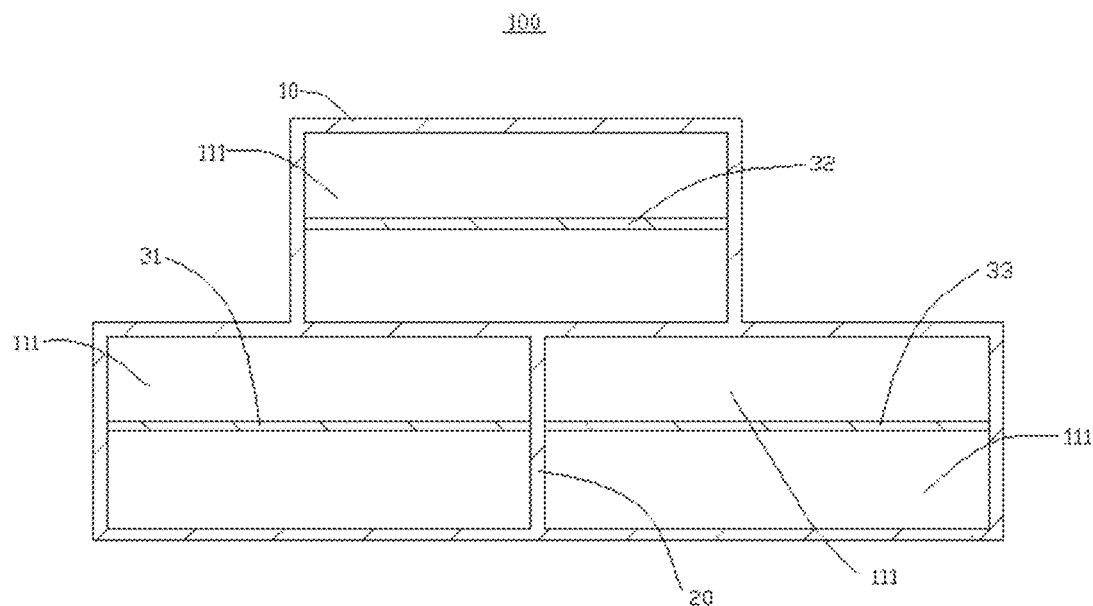
FIG. 5 is a schematic view for showing a sectional structure of an airflow accelerating device according to a fourth example of the first embodiment of the present invention.
Figure 6:
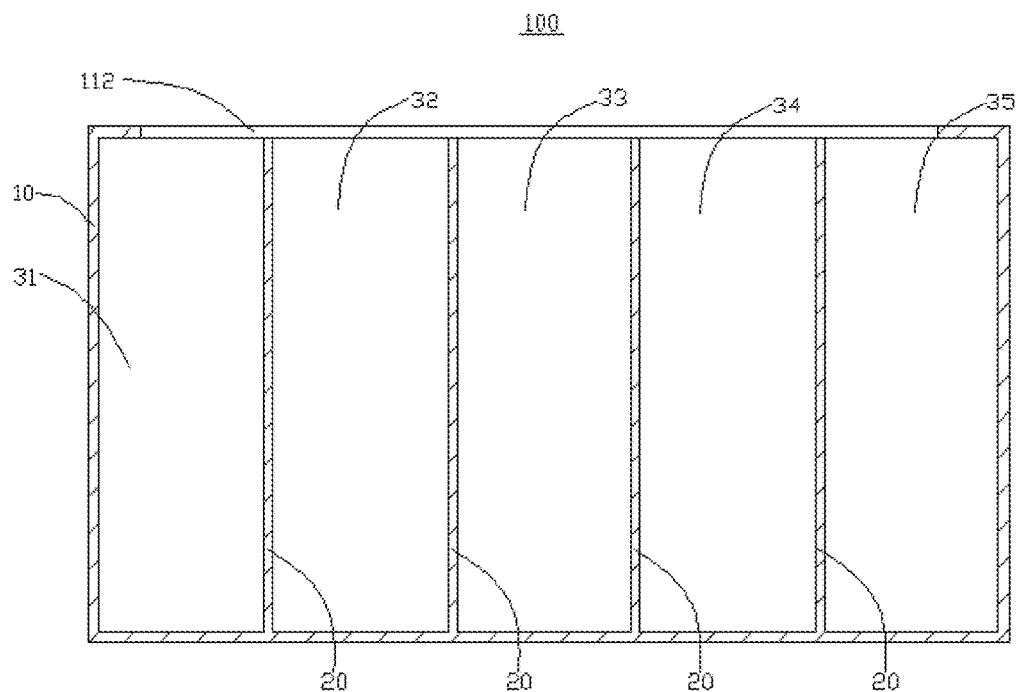
FIG. 6 is a schematic view for showing a sectional structure of an airflow accelerating device according to a fifth example of the first embodiment of the present invention.

The number of the M vibrating plates 30 can be disposed as required. In the first example, M is equal to 2, in other words, the number of the vibrating plates 30 is two, i.e., the first vibrating plate 31 and the second vibrating plate 32. As shown in FIGS. 3-5, in the second to fourth examples, the M is equal to 3, i.e., the number of the vibrating plates 30 is three. In FIG. 6, the number of the vibrating plates 30 is five, while the number of the vibrating plates 30 is six in FIG. 7. They would be explained in detail below. It should be noted that the arrangements of three, four and five vibrating plates or the like are only illustrative, the skilled person in the art can use them as one base unit, to make a larger group including more such vibrating plates by repeating such arrangement many times.

As shown in FIG. 3, it is a schematic view for showing a sectional structure of the airflow accelerating device according to a second example of the first embodiment of the present invention. Specifically, the M vibrating plates 30 further include a third vibrating plate 33, wherein the first, second and third vibrating plates 31, 32, 33 are sequentially arranged within three parallel adjacent sub-chambers 111, and the third vibrating plate 33 has a vibrating direction identical to that of the first vibrating plate 31.

The third vibrating plate 33 having the same vibrating direction as that of the first vibrating plate 31 is provided at the other side of the second vibrating plate 32, so that when the airflow accelerating device 100 starts, due to the vibrating direction of the first and third vibrating plates 31 and 33 opposite to that of the second vibrating plate 32, the vibrating force transmitted to the division plate 20 between the first and second vibrating plates 31 and 32 from the first vibrating plate 31 has the direction opposite to that transmitted to the same division plate 20 from the second vibrating plate 32, and they may counteract one another; the vibrating force transmitted to the division plate 20 between the third and second vibrating plates 33 and 32 from the third vibrating plate 33 has the direction opposite to that transmitted to the same division plate 20 from the second vibrating plate 32, and they may counteract one another. In this way, it will further reduce the influence of the vibration of the first, second and third vibrating plates 31, 32 and 33 to the airflow accelerating device 100 per se or the surrounding structures thereof.

In this example, the first, second and third vibrating plates 31, 32 and 33 are within the same plane. In other examples, as shown in FIG. 4, the first, second and third vibrating plates 31, 32, and 33 are parallel with each other.

In addition, any two of the first, second and third vibrating plates 31, 32 and 33 can be arranged in parallel within the same plane and are parallel with the remaining vibrating plate. As shown in FIG. 5, the third vibrating plate 33 is located at the same plane as the first vibrating plate 31, the vibrating direction of the third vibrating plate 33 is identical to that of the first vibrating direction 31, and the second vibrating plate 32 is parallel to the first and third vibrating plates 31 and 33.

In the case that the first, second and third vibrating plates 31, 32 and 33 has the same dimension, or the sizes of the sub-chambers 111 where they are located are identical, a part of a projection of the second vibrating plate 32 onto the plate where the first vibrating plate 31 is located overlaps with the first vibrating plate 31, and the other part of the projection overlaps with the third vibrating plate 33. For example, as shown in FIG. 5, the second vibrating plate 32 is located above the middle of the first and third vibrating plates 31 and 33.

Because the generated vibrating force is positively proportional to the mass thereof, when the second vibrating plate 32 is disposed onto the first and third vibrating plates 31 and 33, the second vibrating plate 32 is heavier than the first vibrating pate 31 and the third vibrating plate 33. Preferably, the weight of the second vibrating plate 32 is equal to a sum of weights of the first and third vibrating plates 31 and 33. By means of having the weight of the second vibrating plate 32 be greater than the weights of the first vibrating plate 31 and the third vibrating plate 33, or be equal to the sum of the weights of the first and third vibrating plates 31 and 33, the second vibrating plate 32 can counteract the vibration generated by the first and third vibrating plates 31 and 33 as much as possible, thereby further reducing the influence of the vibration of the first, second and third vibrating plates 31, 32, 33 to the airflow accelerating device 100 per se or the surrounding structures thereof.

Moreover, as shown in FIG. 6, the number of the division plates 20 of the airflow accelerating device 100 can be 4, the number of the sub-chambers 111 can be 5, and the number of the vibrating plates 30 can be 5. The five vibrating plates 30 are arranged in parallel within the same plane, while any two adjacent vibrating plates have opposite vibrating directions. In the present example, the number of the vibrating plates is 5. In other examples, the number of the vibrating plates can be 4, 6, 7 or the like. Specifically, the airflow accelerating device 100 includes a fourth vibrating plate 34, which is provided at a side of the third vibrating plate 33 away from the second vibrating plate 32, and has the vibrating direction opposite to that of the third vibrating plate 33. The fifth vibrating plate 35 is provided at a side of the fourth vibrating plate 34 away from the third vibrating plate 33 and having the vibrating direction opposite to that of the fourth vibrating plate 34.

Figure 7:
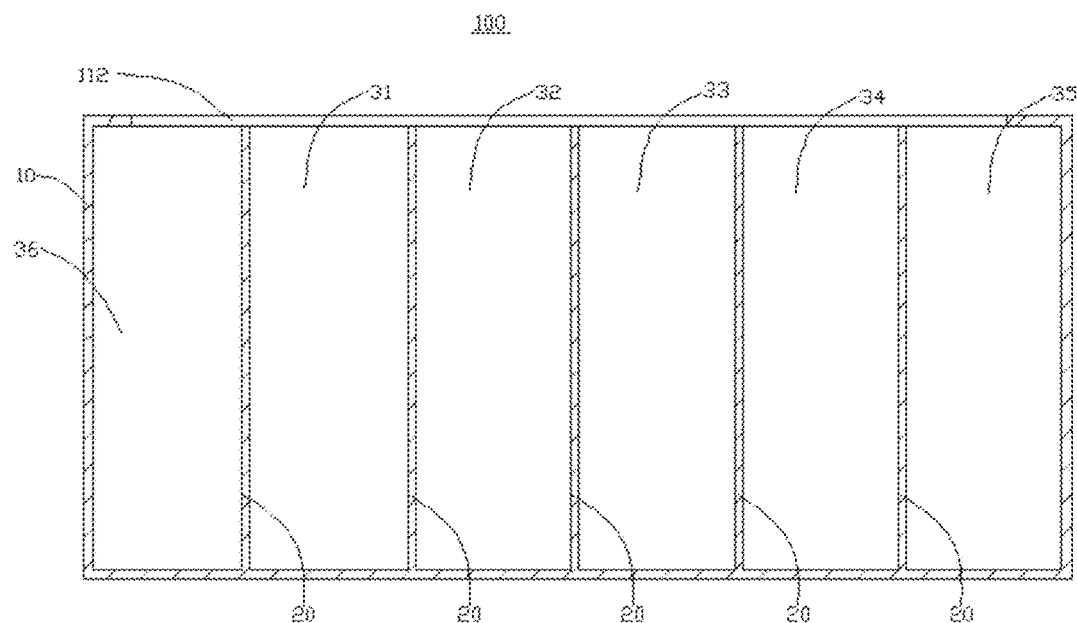
FIG. 7 is a schematic view for showing a sectional structure of an airflow accelerating device according to a sixth example of the first embodiment of the present invention.

Further, as shown in FIG. 7, the number of the division plates 20 in the airflow accelerating device 100 is 5, the number of the sub-chambers 111 is 6, and the number of the vibrating plates 30 is 6. In the present example, the vibrating directions of any two adjacent vibrating plates 30 may be identical or different. Specifically, the airflow accelerating device 100 includes a fifth vibrating plate 35 provided at a side of the fourth vibrating plate 34 away from the third vibrating plate 33 and having the vibrating direction opposite to that of the fourth vibrating plate 34, and a sixth vibrating plate 36 provided at a side of the first vibrating plate 31 away from the second vibrating plate 32 and having the vibrating direction opposite to that of the first vibrating plate 31.

The above described airflow accelerating device 100 is provided with the M–1 division plates 20 for separating the chamber 11 of the housing 10 into the M sub-chambers, and the first and second vibrating plates 31 and 32 are disposed within any two adjacent sub-chambers. When the airflow accelerating device 100 starts, the first vibrating plate 31 has the vibrating direction opposite to that of the second vibrating plate 32, the vibrating force transmitted to the division plate 20 from the first vibrating plate 31 has the direction opposite to that transmitted to the division plate 20 from the second vibrating plate 32, and they may counteract one another. In this way, it reduces the influence of the vibration of the first and second vibrating plates 31 and 32 to the airflow accelerating device 10 per se or the surrounding structures thereof, and reduces the probability that the vibrating frequency of the first and second vibrating plates 31 and 32 can cause them to resonate with the airflow accelerating device 100 per se or the surrounding structures thereof. With such arrangement, this suppresses the issue that after the size of the airflow accelerating device 100 is reduced, the vibrating frequency of the vibrating plates of the airflow accelerating device 100 causes it to resonate with the airflow accelerating device 100 per se or the surrounding structures thereof, thereby resulting in the vibration of the electronic apparatus.

The third vibrating plate 33 having the same vibrating direction as that of the first vibrating plate 31 is provided at the other side of the second vibrating plate 32, so that when the airflow accelerating device 100 starts, since the vibrating directions of the first and third vibrating plates 31 and 33 are opposite to that of the second vibrating plate 32, the vibrating force transmitted to the division plate 20 between the first and second vibrating plates 31 and 32 from the first vibrating plate 31 has the direction opposite to that of the vibrating force transmitted to the division plate 20 from the second vibrating plate 32, and they may counteract one another; and the vibrating force transmitted to the division plate 20 between the third vibrating plate 33 and the second vibrating plate 32 from the third vibrating plate 33 has the direction opposite to that transmitted to the same division plate 20 from the second vibrating plate 32, and they may counteract from each other. Thus, this will further reduce the influence of the vibration of the first, second and third vibrating plates 31, 32, 33 to the airflow accelerating device 100 per se or the surrounding structures thereof.

Figure 8:
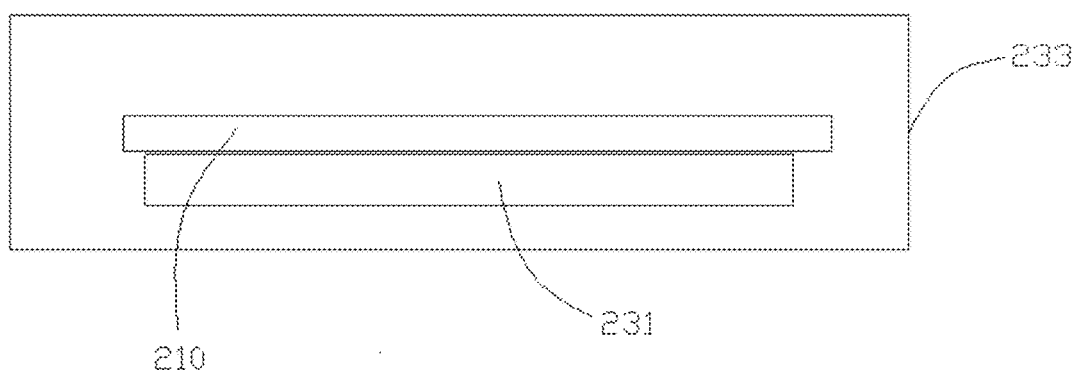
FIG. 8 is a schematic view for showing a construction of the electronic apparatus provided with the airflow accelerating device according to the first embodiment of the present invention.

The weight of the second vibrating plate 32 is configured to be greater than that of the first vibrating plate 31 and that of the third vibrating plate 33, or be equal to the sum of the weights of the first and third vibrating plates 31 and 33, so that the second vibrating plate 32 can counteract the vibration generated by the first and third vibrating plates 31 and 33 as much as possible, and further reduce the influence of the vibration of the first, second and third vibrating plates 31, 32, 33 to the airflow accelerating device 100 per se or the surrounding structures thereof Based on the same inventive concept, an embodiment of the present invention also provides an electronic apparatus having the airflow accelerating device. As shown in FIG. 8, it is a schematic view for showing a construction of the electronic apparatus 200 provided with the airflow accelerating device 210. The electronic apparatus 200 includes a housing 233, a heat generating device 231 and the airflow accelerating device 210.

The heat generating device 231 and the airflow accelerating device 210 are arranged within the housing 233, and the heat generating device 231 can be any device capable of generating heat, for example a processor. The airflow accelerating device 210 is provided on the heat generating device 231, in order to dissipate the heat of the heat generating device 231. The airflow accelerating device 210 can be any one as described in first to sixth examples of the first embodiment.

Specifically, the airflow accelerating device 210 includes a housing, M−1 division plates, and M vibrating plates. The housing has a chamber formed therein, and the M−1 division plates are fixed within the housing, so as to divide the chamber into M sub-chambers. Each one of the M sub-chambers is provided with at least one air outlet, where M is a positive integer greater than 1. The M vibrating plates are respectively arranged within the M sub-chambers, and fixed onto the housing or the division plates. When the airflow accelerating device starts, at least two adjacent vibrating plates among the M vibrating plates have opposite vibrating directions.

In one example, the M vibrating plates are sequentially arranged within the M adjacent sub-chambers along a horizontal direction or a direction perpendicular to the horizontal direction, where any two adjacent vibrating plates among the M vibrating plates have the opposite vibrating directions.

Preferably, the M vibrating plates include at least one group of vibrating plates consisting of the first, second and third vibrating plates, the second vibrating plate is heavier than the first and third vibrating plates.

Preferably, the weight of the second vibrating plate is equal to a sum of weights of the first and third vibrating plates.

In one example, the M vibrating plates include at least one group of vibrating plates consisting of the first, second and third vibrating plates, wherein in each group of the vibrating plates, the third vibrating plate is located adjacent to the first vibrating plate and within the same plane as the first vibrating plate, the second vibrating plate is arranged above the first and the third vibrating plates and parallel to the first and third vibrating plates, where a part of a projection of the second vibrating plate onto a plane where the first vibrating plate is located, overlaps with the first vibrating plate, and the other part of the projection overlaps with the third vibrating plate.

Preferably, the second vibrating plate is heavier than any one of the first and third vibrating plate.

Preferably, the weight of the second vibrating plate is equal to a sum of weights of the first and third vibrating plates.

Within the above described electronic apparatus 200, the above described airflow accelerating device is provided with the M−1 division plates for separating the chamber of the housing into the M sub-chambers, and at least two vibrating plates are disposed within two adjacent sub-chambers. When the airflow accelerating device starts, the first vibrating plate in the two vibrating plates has the vibrating direction opposite to that of the second vibrating plate, and the vibrating direction of the first vibrating plate is opposite to that of the second vibrating plate, the vibrating force transmitted to the division plate from the first vibrating plate has the direction opposite to that transmitted to the division plate from the second vibrating plate, and they may counteract one another. In this way, it reduces the influence of the vibration of the two vibrating plates to the airflow accelerating device per se or the surrounding structures thereof, and reduces the probability that the vibrating frequency of the two vibrating plates can cause them to resonate with the airflow accelerating device per se or the surrounding structures thereof. With such arrangement, this suppresses the issue that after the size of the airflow accelerating device is reduced, the vibrating frequency of the vibrating plates of the airflow accelerating device causes it to resonate with the airflow accelerating device per se or the surrounding structures thereof, thereby resulting in the vibration of the electronic apparatus.

Second Embodiment

The second embodiment of the present invention discloses another kind of vibrating fan, which is different from those described in the first embodiment. The vibrating fan includes a vibrating plate, which can vibrate in a vertical direction being perpendicular to a surface of the vibrating plate. Also, the vibrating fan includes an airflow collecting box (i.e., the housing), provided with at least one air outlet. The at least one air outlet is located at a first surface of the airflow collecting box, and the first surface is one surface of the airflow collecting box parallel to the surface of the vibrating plate. The vibrating plate is fixed within the airflow collecting box, and the airflow or wind generated by vibration of the vibrating plate can be transmitted to outside of the airflow collecting box through the at least one air outlet.

In the present embodiment, within the airflow collecting box, the vibration of the vibrating plate in the vertical direction can produce large amount of wind, and the generated wind can be transmitted to outside of the airflow collecting box through the at least one air outlet. Since the at least one air outlet is located at the first surface, the first surface can be an upper surface of the airflow collecting box when it is horizontally arranged. The wind generated by the vibrating plate can flow to the at least one air outlet within the airflow collecting box, thereby forming the wind in a specific direction, for example, being blown vertically. In this case, when the heat source or the heat sink is present above the airflow collecting box, the heat can be dissipated directly through the wind blowing from the at least one air outlet. In this way, it can ensure the strength of the wind, and provide a better heat dissipating effect for the electronic apparatus.

Figure 9:
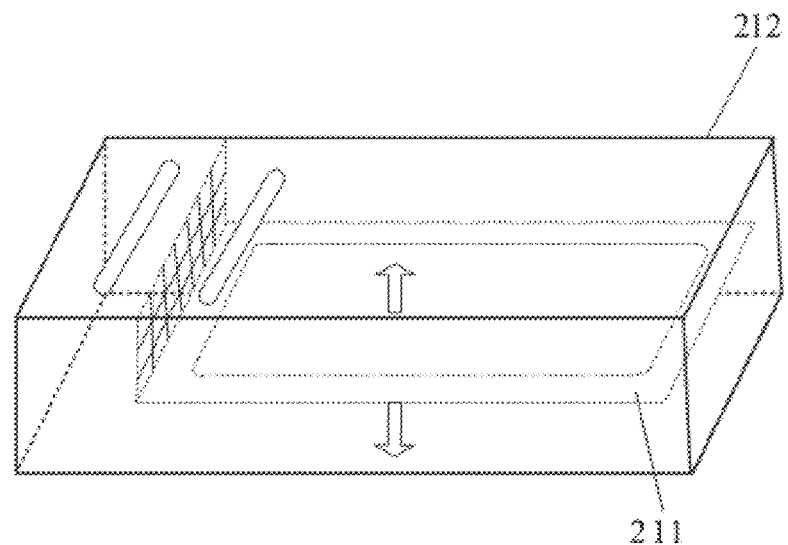
FIG. 9 is a view for showing main structures of a vibration fan according to a second embodiment of the present invention.
Figure 10:
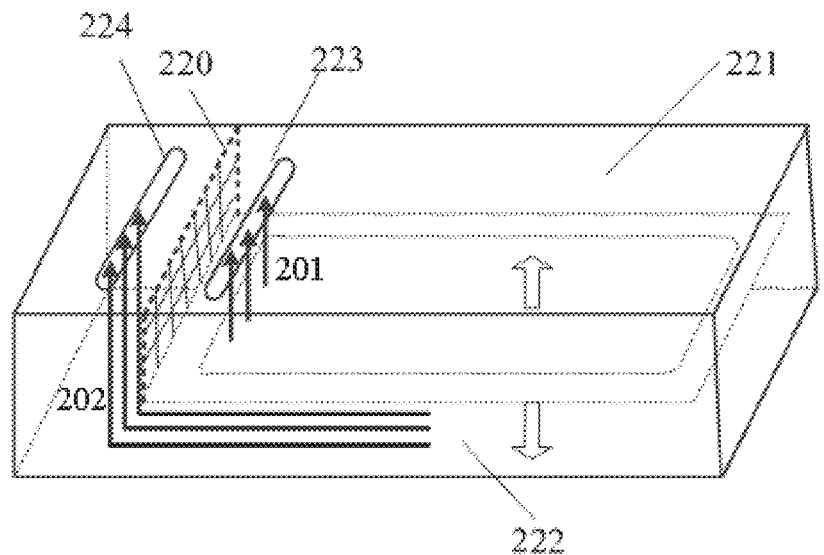
FIG. 10 is a schematic view for showing a construction of an air collecting box according to the second embodiment of the present invention.

Please refer to FIGS. 9 and 10, the second embodiment of the present invention provides a vibrating fan, which may include a vibrating plate 211 and an airflow collecting box 212.

In the present embodiment, the vibrating plate 211 is capable of vibrating in the vertical direction, and the vertical direction is perpendicular to the surface of the vibrating plate 211. Normally, the vibrating plate 211 can be a thin sheet made of a film and a metal sheet. A periphery of the metal sheet can be adhered with the film having elasticity, or the metal sheet can be attached with the elastic film and be located at an area relatively close to the center of the elastic film. Therefore, the vibration of the vibrating plate 211 in the vertical direction means the vibration of the metal sheet in an up and down direction having a higher frequency under the action of magnetic force, thereby forming the vibration in the vertical direction.

In the present embodiment, the airflow collecting box 212 can be disposed with at least one air outlet 223, 224, which is located at the first surface of the airflow collecting box 212. The first surface is one of surfaces of the airflow collecting box 212 parallel to the horizontal surface, and parallel to the surface of the vibrating plate.

In the present embodiment, the first surface may be one of surfaces of the airflow collecting box 212 parallel to the vibrating plate 211, when the airflow collecting box 212 is arranged horizontally. Normally, the airflow collecting box 212 is of cubic structure, and thus the airflow collecting box 212 at least has two surfaces parallel to the vibrating plate 211. For example, when the airflow collecting box 212 is horizontally arranged on the horizontal surface, it can include an upper surface and a lower surface parallel to the vibrating plate 211, and thus the first surface can be the upper surface or the lower surface.

Alternatively, in the present embodiment, the at least one air outlet 223, 224 can be a ventilation hole arranged in the first surface, so as to help the airflow collecting box 212 ventilate the air with the exterior space. In addition, the at least one air outlet can be of specific shape. For example, the at least air outlet 223, 224 can be ventilation holes arranged on the first surface, in a form of rectangle, circle or a hollow structure having other shapes.

In the present embodiment, the wind generated by the vibrating plate 211 can be collected together by the at least one air outlet 223, 224, so that they are transmitted to the heat source or the heat sink to dissipate the heat. For example, the at least one air outlet 223, 224 can be arranged in parallel on the first surface, thus, the relatively concentrated wind can be obtained by the transmission through the at least one air outlet 223, 224. The wind generated by the vibrating plate 211 is transmitted concentratively, thereby obtaining a stronger wind and dissipating heat for other apparatuses. For example, when the vibrating fan is present in the notebook computer, the wind transmitted from the at least one air outlet 223, 224 can be sent to CPU of the notebook computer, by means of a wind passage arranged at the exterior thereof, or the vibrating fan can also be arranged below the CPU of the notebook computer, so that the wind outputted from the at least one air outlet 223, 224 can directly move toward the heat generating CPU, thereby rapidly dissipating the heat.

In the present embodiment, the vibrating plate 211 can be fixed within the airflow collecting box 212, and by means of the at least one air outlet 223, 224, the wind generated by the vibration of the vibrating plate 211 can be sent to outside of the airflow collecting box 212 along a predetermined direction.

Alternatively, in the present embodiment, if the vibrating plate 211 is made of the metal sheet and the elastic film, the vibrating plate 211 can be specifically fixed with the airflow collecting box 212 by the elastic film. For example, the vibrating plate 211 can be located in the middle of interior of the airflow collecting box 212, and the elastic film can be connected with the inner surface of the airflow collecting box 212. For example, the vibrating plate 211 has the same width as that of the airflow collecting box 212, and it is possible to connect the elastic film with the two opposite inner surfaces of the airflow collecting box 212. A distance between the two opposite inner surfaces may be the width of the airflow collecting box 212, and thus the vibrating plate 211 may be fixed within the airflow collecting box 212. In this case, the fixation of the vibrating plate 211 can divide the airflow collecting box 212 into two parts, i.e., an upper space and a lower space.

Alternatively, in the present embodiment, the vibrating fan also may include a blocking wall or a divisional plate 220, fixed within the airflow collecting box 212. The blocking wall 220 is perpendicularly connected with the vibrating plate 211, and forms a L-shaped structure with the vibrating plate 211. The blocking wall 220 is located between the first surface and the vibrating plate 211. By the use of the blocking wall 220 and the vibrating plate 211, the interior of the airflow collecting box 212 is divided into a first chamber 221 and a second chamber 222. In the first chamber 221, the wind generated by the vibrating plate 211 is transmitted to a first air outlet 223 in the at least one air outlet in the vertical direction; while in the second chamber 222, the wind generated by the vibrating plate 211 is transmitted to a second air outlet 224 of the at least one air outlet via a first direction parallel to the vibrating plate 211 and a second direction parallel to the blocking wall 220, wherein the first direction is perpendicular to the second direction.

Alternatively, in the present embodiment, the blocking wall 220 includes a first fixing end and a second fixing end, wherein the first fixing end is connected with the first surface, and the second fixing end is connected with the vibrating plate 211. In other words, the first surface can be a surface of the airflow collecting box 212 connected with the first fixing end. Because the vibrating plate 211 is parallel to the first surface, and the blocking wall 220 is located between the first surface and the vibrating plate 211, the first chamber can be formed within the airflow collecting box 212 and the wind which is generated by the movement of the vibrating plate 211 in the vertical direction is transmitted out of the first chamber, thereby reaching the heat source and dissipating the heat therefrom.

Alternatively, in the present embodiment, the first direction can be the direction parallel to the horizontal plane, and the second direction can be the direction perpendicular to the horizontal plane, i.e., the vertical direction. When the vibrating plate 211 is vibrating in the vertical direction, the wind can be generated alternatively in the first chamber 221 and the second chamber 222. Therefore, when the vibrating plate 211 is vibrating at a higher frequency, the two chambers 221, 222 can continuously transmit the wind through the at least one air outlet 223, 224. When the vibrating plate 211 is vibrating upwardly in the vertical direction, the air in the first chamber 221 is pressed, thereby forming the vertically upward wind. Such wind reaches the first air outlet 223 mainly by the transmission in the vertical direction. When the vibrating plate 211 presses the air in the second chamber 222, the wind generated in the second chamber 222 can reach the second air outlet 224 mainly by the transmission in the first direction and then in the second direction.

In the present embodiment, the first air outlet 223 can be located at a part of the first surface belonging to the first chamber 221, and the second air outlet 224 can be located at the part of the first surface belonging to the second chamber 222.

Alternatively, in the present embodiment, the positions of the first and second air outlets 223 and 224 can be at either side of the blocking wall 220.

Alternatively, in the present embodiment, in the case the length of the vibrating plate 211 can be less than that of the airflow collecting box 212, there may be a communication opening between the first and second chambers 221 and 222. In this way, during the vibration, the vibrating plate 211 can produce the relatively continuous wind through the first and second chambers 221 and 222.

Alternatively, in the present embodiment, a shape of the first chamber 221 is different from that of the second chamber 222. Because the first and second chambers 221 and 222 are two parts which are formed by the separation of the L-shaped structure of the blocking wall 220 and the vibrating plate 211, the first chamber 221 can be a space in a form of cube and the second chamber 222 can be a space in a form of L shape.

In the present embodiment, the blocking wall 220 can be a blocking plate or baffle within the airflow collecting box 212 and perpendicular to the horizontal plane. A length of the blocking wall 220 can be identical with the width of the airflow collecting box 212, so that when the blocking wall 220 is connected to the vibrating plate 211, it is possible to divide the interior of the airflow collecting box 212 into two relatively closed spaces, i.e., the first chamber 221 and the second chamber 222. Meanwhile, one end of the blocking wall 220 can be connected with a first inner surface opposite to the first surface, and the other end of the blocking wall 220 can be connected with the vibrating plate 211, i.e., the blocking wall 220 is perpendicularly located between the first inner surface and the vibrating plate 211, and the blocking wall 220 is connected with one side of the vibrating plate 211, so that the blocking wall 220 and the vibrating plate 211 can form together a L-shaped structure, and separate the airflow collecting box 212 into two chambers.

Continuously referring to FIG. 10, the first air outlet 223 is communicated with the first chamber 221, and the second air outlet 224 is communicated with the second chamber 222. An arrow 201 represents a mainly flowing direction of wind generated by the vibrating plate 211 in the first chamber 221, and an arrow 202 represents a mainly flowing direction of wind generated by the vibrating plate 211 in the second chamber 222, so that the wind generated by the vibration of the vibrating plate 211 can finally be transmitted to the airflow collecting box 212 by the at least one air outlet 223, 224.

Figure 11:
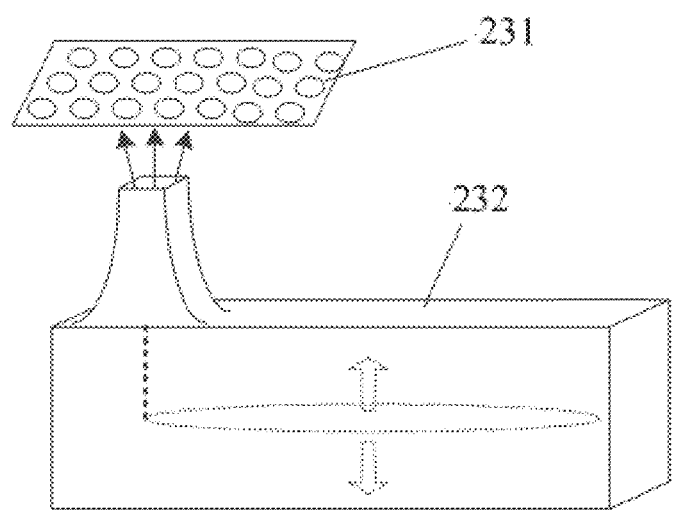
FIG. 11 is a schematic view for showing connection relationship between the vibration fan and the heat generator according to the second embodiment of the present invention.

Please see FIG. 11, which shows an electronic apparatus in accordance with the second embodiment of the present invention. It includes a heat generating device 231 and a vibration fan 232.

In the present embodiment, the heat generating device 231 can be various working components that are capable of generating heat, when the electronic apparatus is in operation. For example, the heat of the notebook computer is mainly originated from CPU (central processing unit), the heat is also produced from the graphic card, and the rest of the heat is produced from others accessories, such as memory, hard disk, battery. Therefore, the heat generating device can mean the device generating a large amount of heat such as the CPU or graphic card and so on. Usually, the heat generated by the plurality of heat generating devices in the electronic apparatus is conducted to the heat sink, and then is quickly dissipated through the cool fan, thereby obtaining a better heat dissipating effect. For example, the heat sink is taken as one example of the heat generating device 231 schematically shown in FIG. 11.

In the present embodiment, the vibrating fan 232 can include a vibrating plate 211 and an airflow collecting box 212. The vibrating plate 211 is capable of vibrating in the vertical direction, and the surface of the vibrating plate 211 is a plane. The airflow collecting box 212 is provided with at least one air outlet 223, 224, which is located at a first surface of the airflow collecting box 212. The first surface is one of surfaces of the airflow collecting box 212 parallel to the horizontal plane and furthest from the horizontal plane. The vibrating plate 211 is fixed within the airflow collecting box 212 and through the at least one air outlet 223, 224, the wind generated by the vibration of the vibrating plate 211 can be transmitted to outside of the airflow collecting box 212.

Alternatively, in the present embodiment, the vibrating plate 211 can be a thin sheet made of a film and a metal sheet, and having a flat structure. A periphery of the metal sheet can be adhered with the film having elasticity, or the metal sheet can be attached with the elastic film and be located at an area relatively close to the center of the elastic film. Therefore, the vibration of the vibrating plate 211 in the vertical direction may be the vibration of the metal sheet in an up and down direction having a higher frequency under the action of magnetic force, thereby forming the vibration in the vertical direction. The vibrating plate 211 can be fixed with the airflow collecting box 212 by the elastic film. For example, the vibrating plate 211 can be in the middle of the interior of the airflow collecting box 212, and the elastic film can be connected with the inner surface of the airflow collecting box 212. For example, the vibrating plate 211 has the same width as that of the airflow collecting box 212. The elastic film can be connected with two opposite inner surfaces of the airflow collecting box 212, the distance between the two opposite inner surfaces is the width of the airflow collecting box 212. Therefore, it is possible to fix the vibrating plate 211 within the airflow collecting box 212. Meanwhile, the fixation of the vibrating plate 211 can divide the airflow collecting box 212 into two parts, the upper space and the lower space.

Alternatively, in the present embodiment, the first surface is one of surfaces of the airflow collecting box 212 parallel to the horizontal plane and having a lager distance from the horizontal plane, when the airflow collecting box 212 is arranged horizontally. Normally, the airflow collecting box 212 is of cubic structure. When the airflow collecting box 212 is horizontally arranged on the horizontal surface, it can include an upper surface and a lower surface parallel to the horizontal plane. Because a first distance of the upper surface from the horizontal plane is larger than a second distance of the lower surface from the horizontal plane, the upper surface of the airflow collecting box 212 is the first surface.

Alternatively, in the present embodiment, the at least one air outlet 223, 224 can be a ventilation hole arranged in the first surface, so as to help the airflow collecting box 212 ventilate the air with the exterior space. In addition, the at least one air outlet 223, 224 can be of specific shape. For example, the at least air outlet 223, 224 can be ventilation holes arranged on the first surface, in a form of rectangle, circle or a hollow structure having other shapes.

In the present embodiment, the heat generating device 231 can be located outside the at least one air outlet 223, 224, and the heat is dissipated by the wind transmitted through the at least one air outlet 223, 224. That is, the heat generating device 231 can be locate close to the at least one air outlet 223, 224, for example, above or at the side of the at least one air outlet 223, 224 and so on. After transmitting the wind generated by the vibrating plate 211 to the airflow collecting box 212 through the at least one air outlet 223, 224, the passage arranged externally is used to continuously transmit the wind to the heat generating device 231 or the heat sink for dissipation. For example, when the heat generating device 231 is located above the at least one air outlet 223, 224, the wind can be directly sent toward the heat generating device through the at least one air outlet 223, 224, so as to dissipate the heat. Alternatively, it is possible to use the designed passage (for example the vertical passage) to transmit the wind to the heat generating device 231. Since the passage is capable of concentrating the transmitted wind, a relatively stronger wind is provided to the heat generating device 231, and thus has a good dissipating effect.

Alternatively, in the present embodiment, the heat generating device 231 can be connected with the at least one air outlet 223, 224 through a heat pipe, and thus the heat generating device 231 can make the generated heat to be dissipated firstly and rapidly through the heat pipe and then the heat accumulated in the heat pipe is further dissipated by a strong wind from the at least one air outlet 223, 224 disposed within the vibration fan 232, as the heat pipe connected with the at least one air outlet 223, 224.

Alternatively, in the present embodiment, the vibrating fan 232 may also include a blocking wall 220, fixed within the airflow collecting box 212. The blocking wall 220 is perpendicularly connected with the vibrating plate 211, and forms a L-shaped structure with the vibrating plate 211. The blocking wall 220 is located between the first surface and the vibrating plate 211. By the use of the blocking wall 220 and the vibrating plate 211, the interior of the airflow collecting box 212 is divided into a first chamber 221 and a second chamber 222. In the first chamber 221, the wind generated by the vibrating plate 211 is transmitted to a first air outlet 223 of the at least one air outlet in the vertical direction; while in the second chamber 222, the wind generated by the vibrating plate 211 is transmitted to a second air outlet 224 in the at least one air outlet via a first direction parallel to the vibrating plate 211 and a second direction parallel to the blocking wall 220, where the first direction is perpendicular to the second direction.

The present embodiment of the present invention provides a vibration fan 232. It includes a vibrating plate 211 which is capable of vibrating in the vertical direction. The vertical direction is the direction perpendicular to the surface of the vibrating plate. It also includes an airflow collecting box 212, provided with at least one air outlet 223, 224. The at least one air outlet 223, 224 is located at a first surface of the airflow collecting box 212, which is one of surfaces of the airflow collecting box 212 parallel to the surface of the vibrating plate. The vibrating plate 211 is fixed within the airflow collecting box 212, and the wind generated by the vibration of the vibrating plate 211 can be transmitted to outside of the airflow collecting box 212.

In the present embodiment, within the airflow collecting box 212, the vibration of the vibrating plate 211 in the vertical direction can produce a large amount of wind, and the generated wind can be transmitted to outside of the airflow collecting box 212 through the at least one air outlet 223, 224. Since the at least one air outlet 223, 224 is located at the first surface, the first surface may be the upper surface when the airflow collecting box is horizontally arranged, the wind generated by the vibrating plate 211 can flow toward the at least one air outlet 223, 224 within the airflow collecting box 212, thereby forming a wind having a specific direction, for example vertically blowing. When the heat source or the heat sink is present above the airflow collecting box 212, the heat can be dissipated directly through the wind blowing from the at least one air outlet 223, 224. In this way, it ensures the strength of the wind, and provides a better heat dissipating effect for the electronic apparatus.

The unit which is illustrated as a separate part, can be or not be physically separate, and the component shown as a unit can be or not be a physical unit. That is, they can be located at the same place, or distributed on a plurality of network units. It is possible to select a part or all of the units to implement the solutions of the present embodiments as actually required.

Although the present invention has been explained with reference to the drawings, the embodiments shown in the drawings are only illustrative, instead of limiting the present invention.

Although some embodiments of the general inventive concept are illustrated and explained, it would be appreciated by those skilled in the art that modifications and variations may be made in these embodiments without departing from the principles and spirit of the general inventive concept of the disclosure, the scope of which is defined in the appended claims and their equivalents.

What is claimed is:

1. An airflow accelerating device, comprising:
    a housing, having a chamber formed therein;
    at least one vibrating plate, disposed within the chamber;
    at least one division plate, fixed in the housing, for dividing the chamber into at least two sub-chambers, each of the at least two sub-chambers having at least one air outlet configured to transmit airflow generated by vibration of the at least one vibrating plate to outside of the chamber, wherein the at least one division plate comprises M−1 division plates, for dividing the chamber into M sub-chambers, wherein M is a positive integer greater than 1;
    the at least one vibrating plate comprises M vibrating plates, disposed within the M sub-chambers respectively, and fixed on the housing or the division plate;
    wherein in the case that the airflow accelerating device starts, at least two adjacent vibrating plates among the M vibrating plates have opposite vibrating directions,
    wherein the M vibrating plates comprises at least one group of vibrating plates, the at least one group of vibrating plates comprises a first, a second and a third vibrating plates, and
    the first vibrating plate and the third vibrating plate are located adjacent to each other in a plane and have the same vibrating direction, and the second vibrating plate is located parallel to the plane;
    wherein at least one part of a projection of the second vibrating plate onto the plane overlaps with the first vibrating plate and at least another part of the projection overlaps with the third vibrating plate, and wherein the second vibrating plate is heavier than any one of the first and third vibrating plates.

2. The airflow accelerating device as claimed in claim 1, wherein the M vibrating plates are sequentially arranged within the M adjacent sub-chambers, and any two adjacent vibrating plates among the M vibrating plates have opposite vibrating directions.

3. The airflow accelerating device as claimed in claim 1, wherein the weight of the second vibrating plate is equal to a sum of weights of the first and third vibrating plates.

4. The airflow accelerating device as claimed in claim 2, wherein the M vibrating plates include at least one group of vibrating plates, the at least one group of vibrating plates comprises a first, a second and a third vibrating plates, the second vibrating plate is heavier than any one of the first and third vibrating plates.

5. The airflow accelerating device as claimed in claim 4, wherein the weight of the second vibrating plate is equal to a sum of weights of the first and third vibrating plates.

6. The airflow accelerating device as claimed in claim 1, wherein the at least one vibrating plate is one vibrating plate, which is capable of vibrating in a vertical direction perpendicular to the surface of the vibrating plate;
    the division plate is perpendicularly connected with the vibrating plate to form a L-shaped structure with the vibrating plate, and the housing is divided into a first sub-chamber and a second sub-chamber by the division plate and the vibrating plate, and wind generated by the vibration of the vibrating plate is transmitted to outside of the first and second sub-chambers through at least one air outlet of the first sub-chamber and the second sub-chamber on a same surface of the housing.

7. The airflow accelerating device as claimed in claim 6, wherein the same surface is one of surfaces of the housing parallel to the surface of the vibrating plate.

8. The airflow accelerating device as claimed in claim 7, wherein in the first sub-chamber the wind generated by the vibration plate is transmitted to a first air outlet in the at least one air outlet in the vertical direction; while in the second sub-chamber, the wind generated by the vibrating plate is transmitted to a second air outlet in the at least one air outlet via a first direction parallel to the vibrating plate and a second direction parallel to the division plate, wherein the first direction is perpendicular to the second direction.

9. The airflow accelerating device as claimed in claim 8, wherein the division plate includes a first fixation end and a second fixation end, wherein the first fixation end is connected with the first surface, and the second fixation end is connected with the vibrating plate.

10. The airflow accelerating device as claimed in claim 9, wherein the first air outlet is located at a part of the first surface belonging to the first sub-chamber, and the second air outlet is located at the other part of the first surface belonging to the second sub-chamber.

11. The airflow accelerating device as claimed in claim 10, wherein the first and second air outlets are positioned at either side of the division plate respectively.

12. The airflow accelerating device as claimed in claim 11, wherein a shape of the first sub-chamber is different from a shape of the second sub-chamber.

13. An electronic apparatus, comprising:
a heat generating device;
the airflow accelerating device as claimed in claim 1, so as to dissipate heat of the heat generating device.

14. The electronic apparatus as claimed in claim 13, wherein the M vibrating plates are sequentially arranged within the M adjacent sub-chambers and any two adjacent vibrating plates among the M vibrating plates have opposite vibrating directions,
the M vibrating plates comprise at least one group of vibrating plates, the at least one group of vibrating plates comprises a first, a second and a third vibrating plates, and the second vibrating plate is heavier than any one of the first and third vibrating plates.

15. The electronic apparatus as claimed in claim 13, wherein the M vibrating plates comprise at least one group of vibrating plates, and the at least one group of vibrating plates comprises a first, a second and a third vibrating plates, and
the first vibrating plate and the third vibrating plate are located adjacent to each other in a plane and have the same vibrating direction, and the second vibrating plate is located parallel to the plane, wherein at least one part of a projection of the second vibrating plate onto the plane overlaps with the first vibrating plate, and at least another part of the projection overlaps with the third vibrating plate,
wherein the second vibrating plate is heavier than any one of the first and third vibrating plates.

16. An electronic apparatus, comprising:
a heat generating device;
the airflow accelerating device as claimed in claim 6, to dissipate heat of the heat generating device.

17. The electronic apparatus as claimed in claim 16, wherein the same surface is one of surfaces of the housing parallel to the surface of the vibrating plate,
wherein in the first sub-chamber the wind generated by the vibration plate is transmitted to a first air outlet in the at least one air outlet in the vertical direction; while in the second sub-chamber, the wind generated by the vibrating plate is transmitted to a second air outlet in the at least one air outlet via a first direction parallel to the vibrating plate and a second direction parallel to the division plate, wherein the first direction is perpendicular to the second direction.

* * * * *